United States Patent
Hu et al.

(10) Patent No.: US 11,297,421 B2
(45) Date of Patent: Apr. 5, 2022

(54) SIGNAL PROCESSING BIAS CIRCUIT FOR MICROPHONE

(71) Applicant: Beken Corporation, Shanghai (CN)

(72) Inventors: Desheng Hu, Shanghai (CN); Donghui Gao, Shanghai (CN); Jiazhou Liu, Shanghai (CN); Dawei Guo, Shanghai (CN)

(73) Assignee: Beken Corporation, Shanghai (CN)

(*) Notice: Subject to any disclaimer, the term of this patent is extended or adjusted under 35 U.S.C. 154(b) by 262 days.

(21) Appl. No.: 16/843,522

(22) Filed: Apr. 8, 2020

(65) Prior Publication Data

US 2021/0297774 A1 Sep. 23, 2021

(30) Foreign Application Priority Data

Mar. 19, 2020 (CN) .......................... 202010196056.4

(51) Int. Cl.
*H04R 3/00* (2006.01)
*H03F 3/45* (2006.01)
*H03M 1/66* (2006.01)

(52) U.S. Cl.
CPC ................ *H04R 3/00* (2013.01); *H03F 3/45* (2013.01); *H03M 1/66* (2013.01)

(58) Field of Classification Search
CPC ...................................................... H04R 3/00
See application file for complete search history.

(56) References Cited

U.S. PATENT DOCUMENTS

| | | | |
|---|---|---|---|
| 7,551,028 B1* | 6/2009 | Cyrusian ................. | H03F 3/217 330/10 |
| 8,786,477 B1* | 7/2014 | Albinet ................. | H03M 1/661 341/139 |
| 9,356,615 B1* | 5/2016 | Ranjbar .................. | H03M 1/68 |
| 10,727,859 B1* | 7/2020 | Agrawal ............... | H03M 3/464 |
| 11,018,681 B1* | 5/2021 | Hamilton ................. | H03K 5/24 |
| 2019/0007008 A1* | 1/2019 | Berkhout ............. | H03F 3/2175 |
| 2019/0342658 A1* | 11/2019 | Kirkpatrick ............ | H04R 1/406 |
| 2021/0351756 A1* | 11/2021 | Gao ........................ | H03M 1/66 |

* cited by examiner

*Primary Examiner* — Olisa Anwah
(74) *Attorney, Agent, or Firm* — Schwegman Lundberg & Woessner, P.A.

(57) ABSTRACT

A bias circuit includes a digital-to-analog converter configured to receive a digital input and output an analog signal; an integrator coupled to a first node that is coupled to the digital-to-analog converter and an amplifier, and coupled to a second node that is coupled to a positive input port of a first comparator and a negative input port of a second comparator; the digital signal processor coupled to an output port of the first comparator and an output port of the second comparator, and coupled to an input port of the digital-to-analog converter.

19 Claims, 2 Drawing Sheets

SIGNAL PROCESSING BIAS CIRCUIT FOR MICROPHONE

CROSS REFERENCE TO RELATED APPLICATIONS

This application claims priority to and incorporates by reference CN 202010196056.4 filed on Mar. 19, 2020.

TECHNICAL FIELD

The present disclosure generally relates to a signal processing bias circuit for a microphone.

BACKGROUND

A bias circuit supplies a steady voltage and direct current to electronic devices. Many electronic devices such as microphones whose function is processing time-varying (AC) signals also require a steady direct current ("DC current") or voltage to operate correctly—a bias. The AC signal applied to them is superposed on this DC bias current or voltage.

Traditional bias circuits for microphones reside outside of an integrated circuit (or "chip"). A traditional bias circuit may include a few resistors and capacitors which may take up plenty of space on the printed circuit board in general purpose computers and other expandable systems. Therefore, designing a bias circuit into an integrated circuit is desirable, because not only does it reduce real estate on a printed circuit board, but also saves costs on individual electronic components, such as certain capacitors.

SUMMARY

An embodiment provides a bias circuit comprising a digital-to-analog converter configured to receive a digital input and output an analog signal, first and second comparators, an integrator coupled to a first node that is coupled to the digital-to-analog converter and an amplifier, and coupled to a second node that is coupled to a positive input port of the first comparator and a negative input port of the second comparator, the positive input port of the first comparator is coupled to the second node, a negative input port of the first comparator is coupled to a reference voltage generator, and an output port of the first comparator is coupled to a digital signal processor, a positive input port of the second comparator is coupled to the reference voltage generator, the negative input port of the second comparator is coupled to the second node, and an output port of the second comparator is coupled to the digital signal processor, the digital signal processor coupled to the output port of the first comparator and the output port of the second comparator, and coupled to an input port of the digital-to-analog converter.

In an embodiment of the bias circuit, the digital signal processor repeatedly generates a different digital signal based on a first decision result of the first comparator and a second decision result of the second comparator, wherein the digital signal processor ceases generating the different digital signal when both the first and second decision results are logic low.

In an embodiment of the bias circuit, the integrator comprises a second operational amplifier wherein a positive input port of the second operational amplifier is coupled to a voltage of common mode, an adjustable second resistor coupled to an output port of the second operational amplifier and the first node, a first capacitor coupled between the output port of the second operational amplifier and a negative input port of the second operational amplifier, and a first resistor coupled to the negative input port of the second operational amplifier.

In an embodiment of the bias circuit, the first node is coupled to an output port of the digital-to-analog converter that is coupled to a microphone.

In an embodiment of the bias circuit, the digital-to-analog converter is an 8-bit current output digital-to-analog converter.

Another embodiment provides a circuit comprising, a digital-to-analog converter configured to receive a digital input and output an analog signal, an amplifier comprising a first operational amplifier and an adjustable reference resistor coupled between a negative input port of the first operational amplifier and an output port of the first operational amplifier, an analog-to-digital converter coupled between the output port of the first operational amplifier and a digital signal processor, first and second comparators, an integrator coupled to a first node that is coupled to the digital-to-analog converter and an amplifier, and coupled to a second node that is coupled to a positive input port of the first comparator and a negative input port of the second comparator, the positive input port of the first comparator is coupled to the second node, a negative input port of the first comparator is coupled to a reference voltage generator, and an output port of the first comparator is coupled to the digital signal processor, a positive input port of the second comparator is coupled to the reference voltage generator, the negative input port of the second comparator is coupled to the second node, and an output port of the second comparator is coupled to the digital signal processor, the digital signal processor coupled to the output port of the first comparator, the output port of the second comparator and the analog-to-digital converter, and coupled to an input port of the digital-to-analog converter.

In an embodiment of the bias circuit, the digital signal processor repeatedly generates a different digital signal based on a first decision result of the first comparator and a second decision result of the second comparator, wherein the digital signal processor ceases generating the different digital signal when both the first and second decision results are logic low.

In an embodiment of the bias circuit, the integrator comprises a second operational amplifier wherein a positive input port of the second operational amplifier is coupled to a voltage of common mode, an adjustable second resistor coupled to an output port of the second operational amplifier and the first node, a first capacitor coupled between the output port of the second operational amplifier and a negative input port of the second operational amplifier, and a first resistor coupled to the negative input port of the second operational amplifier.

In an embodiment of the bias circuit, the first node is coupled to an output port of the digital-to-analog converter that is coupled to a microphone.

In an embodiment of the bias circuit, the digital-to-analog converter is an 8-bit current output digital-to-analog converter.

Another embodiment provides a method of generating an analog signal with a bias circuit, comprising generating, by a digital-to-analog converter, an analog signal, generating, by an amplifier, a first voltage at an output port of a first operational amplifier, generating, by an integrator, a second voltage result by comparing a reversed first voltage at a negative input port of a second operational amplifier and a voltage of common mode at a positive input port of the second operational amplifier, comparing, by a first comparator, the second voltage and a first reference voltage, comparing, by a second comparator, the second voltage and a second reference voltage, generating, by a digital signal processor, a digital signal result by processing a first decision result of the first comparator and a second decision result of the second comparator, generating, by the digital signal processor, a digital signal at an input port of the digital-to-analog converter, generating, by the digital-to-analog converter, the analog signal at a negative input port of the first operational amplifier.

In an embodiment of the method of generating the analog signal with the bias circuit, further comprising repeatedly generating, with the digital signal processor, a different digital signal based on the first decision result of the first comparator and the second decision result of the second comparator, wherein the digital signal processor ceases generating the different digital signal when both the first and second decision results are logic low.

In an embodiment of the method of generating the analog signal with the bias circuit, the integrator coupled to a first node that is coupled to the digital-to-analog converter and the amplifier, and coupled to a second node that is coupled to a positive input port of the first comparator and a negative input port of the second comparator, the first comparator, wherein the positive input port of the first comparator is coupled to the second node, a negative input port of the first comparator is coupled to a reference voltage generator, and an output port of the first comparator is coupled to the digital signal processor, the second comparator, wherein a positive input port of the second comparator is coupled to the reference voltage generator, the negative input port of the second comparator is coupled to the second node, and an output port of the second comparator is coupled to the digital signal processor, the digital signal processor coupled to the output port of the first comparator and the output port of the second comparator, and coupled to the input port of the digital-to-analog converter.

In an embodiment of the method of generating the analog signal with the bias circuit, the integrator comprises the second operational amplifier wherein the positive input port is coupled to the voltage of common mode, an adjustable second resistor coupled to the output port of the second operational amplifier and the first node, a first capacitor coupled between the output port of the second operational amplifier and the negative input port of the second operational amplifier, and a first resistor coupled to the negative input port of the second operational amplifier.

In an embodiment of the method of generating the analog signal with the bias circuit, the first node is coupled to the output port of the digital-to-analog converter that is coupled to a microphone.

In an embodiment of the method of generating the analog signal with the bias circuit, further comprising providing the analog signal to the microphone.

In an embodiment of the method of generating the analog signal with the bias circuit, the digital-to-analog converter is an 8-bit current output digital-to-analog converter.

In an embodiment of the method of generating the analog signal with the bias circuit, the bias circuit resides in an integrated circuit.

In an embodiment of the method of generating the analog signal with the bias circuit, the first reference voltage is higher than the second reference voltage.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various aspects and examples will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
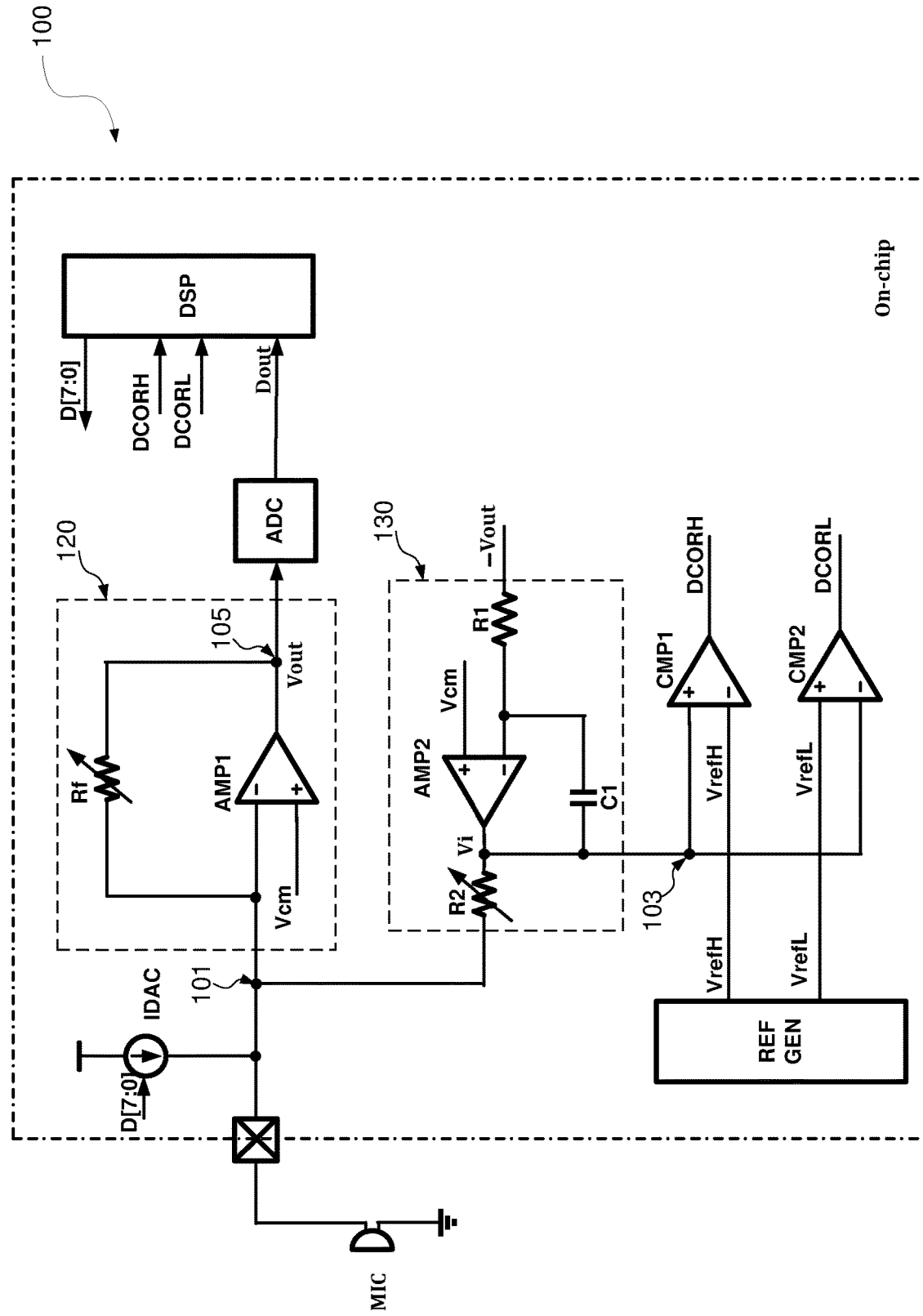
FIG. 1 is a circuit diagram of signal processing bias circuit for microphone according to an embodiment.

FIG. 1 is a circuit diagram of a signal processing bias circuit 100 for microphone according to an embodiment. According to some embodiments, a bias circuit 100 comprises a digital-to-analog converter IDAC, a first comparator CMP1, a second comparator CMP2, an integrator 130 and a digital signal processor DSP. The digital-to-analog converter IDAC configured to receive a digital input D[7:0] and output an analog signal. The integrator 130 is coupled to a first node 101 that is coupled to the digital-to-analog converter IDAC and an amplifier 120. The integrator 130 is also coupled to a second node 103 that is coupled to a positive input port of the first comparator CMP1 and a negative input port of the second comparator CMP2.

In some embodiments, the positive input port of the first comparator CMP1 is coupled to the second node 103. A negative input port of the first comparator CMP1 is coupled to a reference voltage generator REF GEN. An output port of the first comparator CMP1 is coupled to the digital signal processor DSP. A positive input port of the second comparator CMP2 is coupled to the reference voltage generator REF GEN. The negative input port of the second comparator CMP2 is coupled to the second node 103, and an output port of the second comparator CMP2 is coupled to the digital signal processor DSP. In some embodiments, the digital signal processor DSP is coupled to the output port of the first comparator CMP1 and the output port of the second comparator CMP2, and is coupled to an input port of the digital-to-analog converter IDAC.

According to some embodiments the integrator 130 comprises a second operational amplifier AMP2, a first resistor R1, an adjustable second resistor R2 and a first capacitor C1. The positive input port of the second operational amplifier AMP2 is coupled to a voltage of common mode Vcm. The adjustable second resistor R2 is coupled to an output port of the second operational amplifier AMP2 and the first node 101. The first capacitor C1 is coupled between the output port of the second operational amplifier AMP2 and a negative input port of the second operational amplifier AMP2, and the first resistor R1 is coupled to the negative input port of the second operational amplifier AMP2.

According to some embodiments, the first node 101 is coupled to an output port of the digital-to-analog converter IDAC that is coupled to a microphone MIC. The digital-to-analog converter IDAC is an 8-bit current output digital-to-analog converter.

According to some embodiments, the digital signal processor DSP repeatedly generates a different digital signal D[7:0] based on a first decision result DCORH of the first comparator CMP1 and a second decision result DCORL of the second comparator CMP. The digital signal processor DSP ceases generating the different digital signal D[7:0] when both the first decision result DCORH and the second decision result DCORL are logic low.

According to some embodiments, the circuit 100 comprises a digital-to-analog converter IDAC, an amplifier 120, an analog-to-digital converter ADC, a first comparator CMP1, a second comparator CMP2, an integrator 130, and a digital signal processor DSP. The amplifier 120 comprises a first operational amplifier AMP1 and an adjustable reference resistor Rf coupled between a negative input port of the first operational amplifier AMP1 and an output port of the first operational amplifier AMP1. The analog-to-digital converter ADC is coupled between the output port of the first operational amplifier AMP1 and a digital signal processor DSP. The integrator 130 is coupled to a first node 101 that is coupled to the digital-to-analog converter IDAC and an amplifier 120, and is coupled to a second node 103 that is coupled to a positive input port of the first comparator CMP1 and a negative input port of the second comparator CMP2.

In some embodiments, when the circuit 100 is powered on, the digital-to-analog converter IDAC as an 8-bit current output digital-to-analog converter outputs a direct current (an analog signal) to the microphone MIC. Because microphone made by different manufacturers have different DC current requirements under which the microphones intend to operate, the bias circuit is to provide a normal operating point for the microphone to ensure the microphones are able to function as intended in the circuit 100 environment. The IDAC provides the required DC current and voltage for the microphone MIC. When the current at the output of IDAC exceeds the predetermined range defined between the reference voltages VrefL and VrefH, the digital signal processor DSP adjusts the digital output D[7:0] to be input at the input port of the IDAC, in order to adjust the value of the direct current at the output of IDAC.

According to some embodiments, the analog signal passes through an amplifier 120, which outputs a voltage Vout at a third node 105. In some embodiments, an inverting amplifier with a gain of 1 (not shown) or an inverting buffer may be coupled between the output port of the first operational amplifier AMP1 and the positive input port of the second operational amplifier AMP2, so that the input voltage (−Vout) at the positive input port of the second operational amplifier AMP2 is an inverted voltage of the voltage Vout at the third node 105.

The output voltage Vi of the second operational amplifier AMP2 at the output port of the second operational amplifier AMP2 is input at the positive input port of the first comparator CMP1. The first comparator CMP1 compares the output voltage Vi with a first reference voltage VrefH. The decision result DCORH of the first comparator CMP1 is output to the digital signal processor as DCORH. The output voltage Vi is input at the negative input port of the second comparator CMP2. The second comparator CMP2 compares the output voltage Vi with a second reference voltage VrefL, and outputs the decision result to the digital signal processor as DCORL. VrefH is configured to be higher than the VrefL.

By detecting the output voltage Vout of the amplifier 120 via the bias circuit, the digital signal processor DSP is able to generate, at the digital-to-analog converter IDAC, a different digital output D[7:0] based on the first decision result of the first comparator and the second decision result of the second comparator. Thereby the digital signal processor DSP is able to adjust the value of the direct current to be output to the microphone MIC at the output of the digital-to-analog converter IDAC. The digital signal processor ceases to generate a different digital output D[7:0] when both first decision result of the first comparator and the second decision result of the second comparator are logic low. Any person of ordinary skill in the art would appreciate that logic low also refers to low state or 0.

According to some embodiments, when the circuit 100 is powered on, if the first decision result DCORH of the first comparator CMP1 is 1 or logic high, the digital signal processor adjusts the digital output D[7:0] from the default setting 1000,000 to a new setting 0100,000. If the second decision result DCORL of the second comparator CMP2 is 1 or logic high, the digital signal processor DSP adjusts the digital output D[7:0] from the default setting 1000,000 to a new setting 1100,000. The digital signal processor DSP ceases generating a new setting for the digital output D[7:0] when both first decision result of the first comparator and the second decision result of the second comparators are logic low or 0. Because the generation of different digital signals by the digital signal processor DSP does not involve steps of analog signal to digital signal conversion, therefore the bias circuit is able to quickly provide DC current to a microphone that meets the manufacturing requirements once the circuit 100 is powered on.

Figure 2:
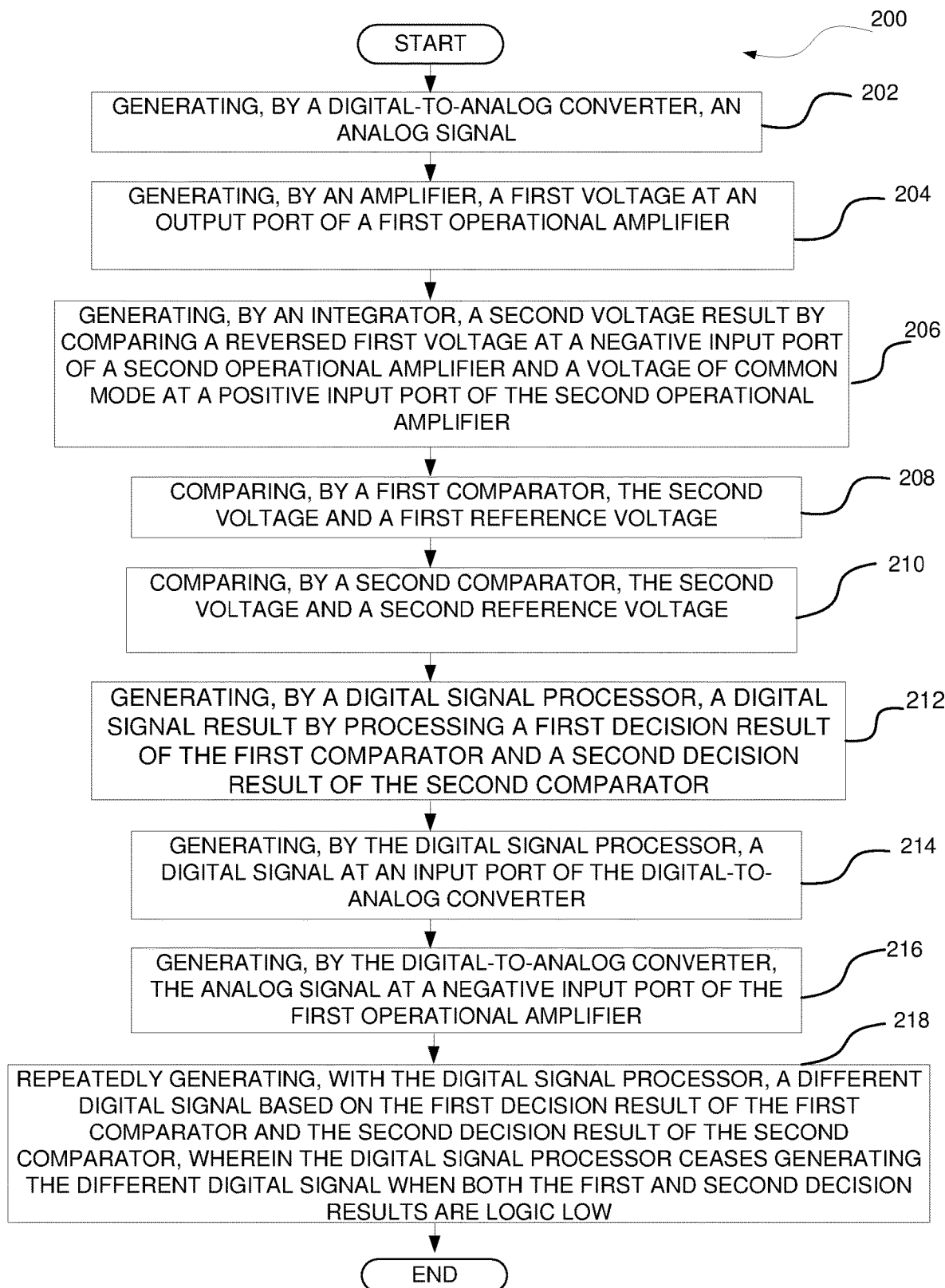
FIG. 2 is a flow chart of a method of generating an analog signal with a bias circuit according to an embodiment.

FIG. 2 is a flow chart of a method 200 of generating an analog signal with a bias circuit according to an embodiment. According to some embodiments, the method 200 may begin at operation 202 with a digital-to-analog converter IDAC generating an analog signal. The digital-to-analog converter IDAC may be an 8-bit current output digital-to-analog converter. At operation 204 by an amplifier 120 generating a first voltage Vout at an output port of a first operational amplifier. At operation 206 by an integrator 130 generating a second voltage Vi result by comparing a reversed first voltage −Vout at a negative input port of a second operational amplifier AMP2 and a voltage of common mode Vcm at a positive input port of the second operational amplifier AMP2. At operation 208 by a first comparator CMP1 comparing the second voltage Vi and a first reference voltage VrefH. At operation 210 by a second comparator CMP2 comparing the second voltage Vi and a second reference voltage VrefL. At operation 212 by a digital signal processor DSP generating a digital signal D[7:0] result by processing a first decision result DCORH of the first comparator CMP1 and a second decision result DCORL of the second comparator CMP2. At operation 214 by the digital signal processor DSP generating a digital signal at an input port of the digital-to-analog converter. At operation 216, by the digital-to-analog converter generating the analog signal at a negative input port of the first operational amplifier. At operation 218 with the digital signal processor repeatedly generating a different digital signal based on the first decision result of the first comparator and the second decision result of the second comparator, wherein the digital signal processor ceases generating the different digital signal when both the first and second decision results are logic low.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present disclosure. Moreover, features of one embodiment may be incorporated into other embodiments, even where those features are not described together in a single embodiment within the present document. Accordingly, the disclosure is described by the appended claims.

What is claimed is:

1. A bias circuit, comprising:
  a digital-to-analog converter configured to receive a digital input and output an analog signal;
  first and second comparators;
  an integrator coupled to a first node that is coupled to the digital-to-analog converter and an amplifier, and coupled to a second node that is coupled to a positive input port of the first comparator and a negative input port of the second comparator;
  the positive input port of the first comparator is coupled to the second node, a negative input port of the first comparator is coupled to a reference voltage generator, and an output port of the first comparator is coupled to a digital signal processor;
  a positive input port of the second comparator is coupled to the reference voltage generator, the negative input port of the second comparator is coupled to the second node, and an output port of the second comparator is coupled to the digital signal processor; and
  the digital signal processor coupled to the output port of the first comparator and the output port of the second comparator, and coupled to an input port of the digital-to-analog converter.

2. The bias circuit in claim 1, wherein the digital signal processor repeatedly generates a different digital signal based on a first decision result of the first comparator and a second decision result of the second comparator, wherein the digital signal processor ceases generating the different digital signal when both the first and second decision results are logic low.

3. The bias circuit in claim 1, wherein the integrator comprises
  a second operational amplifier wherein a positive input port of the second operational amplifier is coupled to a voltage of common mode; and
  an adjustable second resistor coupled to an output port of the second operational amplifier and the first node, a first capacitor coupled between the output port of the second operational amplifier and a negative input port of the second operational amplifier, and a first resistor coupled to the negative input port of the second operational amplifier.

4. The bias circuit in claim 1, wherein the first node is coupled to an output port of the digital-to-analog converter that is coupled to a microphone.

5. The bias circuit in claim 1, wherein the digital-to-analog converter is an 8-bit current output digital-to-analog converter.

6. A circuit comprising:
  a digital-to-analog converter configured to receive a digital input and output an analog signal;
  an amplifier comprising a first operational amplifier and an adjustable reference resistor coupled between a negative input port of the first operational amplifier and an output port of the first operational amplifier;
  an analog-to-digital converter coupled between the output port of the first operational amplifier and a digital signal processor;
  first and second comparators;
  an integrator coupled to a first node that is coupled to the digital-to-analog converter and an amplifier, and coupled to a second node that is coupled to a positive input port of the first comparator and a negative input port of the second comparator;
  the positive input port of the first comparator is coupled to the second node, a negative input port of the first comparator is coupled to a reference voltage generator, and an output port of the first comparator is coupled to the digital signal processor;
  a positive input port of the second comparator is coupled to the reference voltage generator, the negative input port of the second comparator is coupled to the second node, and an output port of the second comparator is coupled to the digital signal processor; and
  the digital signal processor coupled to the output port of the first comparator, the output port of the second comparator and the analog-to-digital converter, and coupled to an input port of the digital-to-analog converter.

7. The circuit in claim 6, wherein the digital signal processor repeatedly generates a different digital signal based on a first decision result of the first comparator and a second decision result of the second comparator, wherein the digital signal processor ceases generating the different digital signal when both the first and second decision results are logic low.

8. The circuit in claim 6, wherein the integrator comprises:
  a second operational amplifier wherein a positive input port of the second operational amplifier is coupled to a voltage of common mode; and
  an adjustable second resistor coupled to an output port of the second operational amplifier and the first node, a first capacitor coupled between the output port of the second operational amplifier and a negative input port of the second operational amplifier, and a first resistor coupled to the negative input port of the second operational amplifier.

9. The circuit in claim 6, wherein the first node is coupled to an output port of the digital-to-analog converter that is coupled to a microphone.

10. The circuit in claim 6, wherein the digital-to-analog converter is an 8-bit current output digital-to-analog converter.

11. A method of generating an analog signal with a bias circuit, comprising:
  generating, by a digital-to-analog converter, an analog signal;
  generating, by an amplifier, a first voltage at an output port of a first operational amplifier;
  generating, by an integrator, a second voltage result by comparing a reversed first voltage at a negative input port of a second operational amplifier and a voltage of common mode at a positive input port of the second operational amplifier;
  comparing, by a first comparator, the second voltage and a first reference voltage;
  comparing, by a second comparator, the second voltage and a second reference voltage;

generating, by a digital signal processor, a digital signal result by processing a first decision result of the first comparator and a second decision result of the second comparator;

generating, by the digital signal processor, a digital signal at an input port of the digital-to-analog converter; and generating, by the digital-to-analog converter, the analog signal at a negative input port of the first operational amplifier.

12. The method of generating the analog signal with the bias circuit in claim 11, further comprising repeatedly generating, with the digital signal processor, a different digital signal based on the first decision result of the first comparator and the second decision result of the second comparator, wherein the digital signal processor ceases generating the different digital signal when both the first and second decision results are logic low.

13. The method of generating the analog signal with the bias circuit in claim 11, wherein the integrator coupled to a first node that is coupled to the digital-to-analog converter and the amplifier, and coupled to a second node that is coupled to a positive input port of the first comparator and a negative input port of the second comparator;

the first comparator, wherein the positive input port of the first comparator is coupled to the second node, a negative input port of the first comparator is coupled to a reference voltage generator, and an output port of the first comparator is coupled to the digital signal processor;

the second comparator, wherein a positive input port of the second comparator is coupled to the reference voltage generator, the negative input port of the second comparator is coupled to the second node, and an output port of the second comparator is coupled to the digital signal processor; and the digital signal processor coupled to the output port of the first comparator and the output port of the second comparator, and coupled to the input port of the digital-to-analog converter.

14. The method of generating the analog signal with the bias circuit in claim 11, wherein the integrator comprises the second operational amplifier wherein the positive input port is coupled to the voltage of common mode;

an adjustable second resistor coupled to the output port of the second operational amplifier and the first node, a first capacitor coupled between the output port of the second operational amplifier and the negative input port of the second operational amplifier, and a first resistor coupled to the negative input port of the second operational amplifier.

15. The method of generating the analog signal with the bias circuit in claim 11, wherein the first node is coupled to the output port of the digital-to-analog converter that is coupled to a microphone.

16. The method of generating the analog signal with the bias circuit in claim 15, further comprising providing the analog signal to the microphone.

17. The method of generating the analog signal with the bias circuit in claim 11, wherein the digital-to-analog converter is an 8-bit current output digital-to-analog converter.

18. The method of generating the analog signal with the bias circuit in claim 11, wherein the bias circuit resides in an integrated circuit.

19. The method of generating the analog signal with the bias circuit in claim 11, wherein the first reference voltage is higher than the second reference voltage.

* * * * *